US010297745B2

(12) United States Patent
Tahmasebi et al.

(10) Patent No.: US 10,297,745 B2
(45) Date of Patent: May 21, 2019

(54) COMPOSITE SPACER LAYER FOR MAGNETORESISTIVE MEMORY

(71) Applicant: GLOBALFOUNDRIES Singapore Pte. Ltd., Singapore (SG)

(72) Inventors: Taiebeh Tahmasebi, Singapore (SG); Vinayak Bharat Naik, Singapore (SG); Kangho Lee, Singapore (SG); Chim Seng Seet, Singapore (SG); Kazutaka Yamane, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/339,928

(22) Filed: Oct. 31, 2016

(65) Prior Publication Data

US 2017/0125664 A1 May 4, 2017

Related U.S. Application Data

(60) Provisional application No. 62/249,378, filed on Nov. 2, 2015, provisional application No. 62/325,986, filed on Apr. 21, 2016.

(51) Int. Cl.
*H01L 27/22* (2006.01)
*G11C 11/15* (2006.01)
(Continued)

(52) U.S. Cl.
CPC ............ *H01L 43/02* (2013.01); *H01L 27/228* (2013.01); *H01L 43/08* (2013.01); *H01L 43/10* (2013.01); *H01L 43/12* (2013.01)

(58) Field of Classification Search
CPC ... H01L 27/228; H01L 27/224; H01L 27/226; H01L 27/222; H01L 43/02; H01L 43/08;
(Continued)

(56) References Cited

U.S. PATENT DOCUMENTS 6,518,588 B1 2/2003 Parkin et al.
6,960,480 B1 11/2005 Horng et al.
(Continued)

FOREIGN PATENT DOCUMENTS

CN 103907156 A 7/2014
JP 2009027177 A 2/2009
(Continued)

OTHER PUBLICATIONS

Adrien Le Goff et al., Effect of Ta Insertion in Reference Layers of MTJs With Perpendicular Anisotropy, IEEE Transactions on Magnetics, Nov. 2014, vol. 50, No. 11.
(Continued)

*Primary Examiner* — Andrew Q Tran
(74) *Attorney, Agent, or Firm* — Thompson Hine LLP

(57) ABSTRACT

A bottom pinned perpendicular magnetic tunnel junction (pMTJ) with high TMR which can withstand high temperature back-end-of-line (BEOL) processing is disclosed. The pMTJ includes a composite spacer layer between a SAF layer and a reference layer of the fixed magnetic layer of the pMTJ. The composite spacer layer includes a first non-magnetic (NM) spacer layer, a magnetic (M) spacer layer disposed over the first NM spacer layer and a second NM spacer layer disposed over the M layer. The M layer is a magnetically continuous amorphous layer, which provides a good template for the reference layer.

20 Claims, 15 Drawing Sheets

200

1100

(51) Int. Cl.

| | |
|---|---|
| ***H01L 43/02*** | (2006.01) |
| ***H01L 43/08*** | (2006.01) |
| ***H01L 43/10*** | (2006.01) |
| ***H01L 43/12*** | (2006.01) |

(58) Field of Classification Search
CPC ......... H01L 43/10; H01L 43/12; G11C 11/15; G11C 11/14; G11C 11/161; G11C 11/16
See application file for complete search history.

(56) References Cited

U.S. PATENT DOCUMENTS

| | | | |
|---|---|---|---|
| 7,453,671 | B1 | 11/2008 | Nibarger et al. |
| 9,437,811 | B2 | 9/2016 | Xiao |
| 9,754,653 | B2 * | 9/2017 | Prejbeanu .......... G11C 11/1675 |
| 2004/0174740 | A1 | 9/2004 | Lee et al. |
| 2005/0219769 | A1 | 10/2005 | Shimura et al. |
| 2006/0262594 | A1 | 11/2006 | Fukumoto |
| 2009/0027810 | A1 | 1/2009 | Horng et al. |
| 2009/0046397 | A1 | 2/2009 | Sun et al. |
| 2009/0147392 | A1 | 6/2009 | Prejbeanu et al. |
| 2009/0256220 | A1 | 10/2009 | Horng et al. |
| 2009/0261434 | A1 | 10/2009 | Kang et al. |
| 2010/0072524 | A1 | 3/2010 | Huai et al. |
| 2010/0072566 | A1 | 3/2010 | Kang et al. |
| 2010/0080049 | A1 | 4/2010 | Zheng et al. |
| 2010/0096716 | A1 | 4/2010 | Ranjan et al. |
| 2011/0014500 | A1 | 1/2011 | Horng et al. |
| 2011/0293967 | A1 | 12/2011 | Zhang et al. |
| 2011/0298456 | A1 | 12/2011 | Lu et al. |
| 2012/0135273 | A1 | 5/2012 | Horng et al. |
| 2012/0205759 | A1 | 8/2012 | Hu |
| 2012/0267733 | A1 | 10/2012 | Hu et al. |
| 2012/0286382 | A1 | 11/2012 | Jan et al. |
| 2012/0292724 | A1 | 11/2012 | Lim et al. |
| 2012/0313191 | A1 | 12/2012 | Whig et al. |
| 2013/0075837 | A1 | 3/2013 | Chen et al. |
| 2013/0075839 | A1 | 3/2013 | Chen et al. |
| 2013/0075845 | A1 | 3/2013 | Chen et al. |
| 2013/0187248 | A1 | 6/2013 | Kariyada et al. |
| 2013/0264665 | A1 | 10/2013 | Jan et al. |
| 2014/0027869 | A1 | 1/2014 | Lee et al. |
| 2014/0070341 | A1 | 3/2014 | Beach et al. |
| 2014/0103469 | A1 | 4/2014 | Jan et al. |
| 2014/0117476 | A1 | 5/2014 | Kuo et al. |
| 2014/0145792 | A1 | 5/2014 | Wang et al. |
| 2014/0175583 | A1 | 6/2014 | Doyle et al. |
| 2014/0197504 | A1 | 7/2014 | Moriyama et al. |
| 2014/0273284 | A1 | 9/2014 | Annunziata |
| 2014/0306302 | A1 | 10/2014 | Jan et al. |
| 2015/0008547 | A1 | 1/2015 | Pi et al. |
| 2015/0008550 | A1 | 1/2015 | Min et al. |
| 2015/0061058 | A1 | 3/2015 | Jan et al. |
| 2015/0171316 | A1 | 6/2015 | Park et al. |
| 2016/0043309 | A1 | 2/2016 | Annunziata et al. |
| 2016/0111632 | A1 | 4/2016 | Sandhu et al. |
| 2016/0163970 | A1 | 6/2016 | Xiao |
| 2016/0211445 | A1 | 7/2016 | Xiao |
| 2016/0254445 | A1 | 9/2016 | Tahmasebi et al. |
| 2016/0276580 | A1 | 9/2016 | Tahmasebi et al. |
| 2016/0284763 | A1 | 9/2016 | Tahmasebi et al. |
| 2017/0025602 | A1 | 1/2017 | Liu et al. |

FOREIGN PATENT DOCUMENTS

| | | | |
|---|---|---|---|
| WO | 2011072050 | A1 | 6/2011 |
| WO | 2012154411 | A1 | 11/2012 |
| WO | 2014063939 | A1 | 5/2014 |

OTHER PUBLICATIONS

Maria Patricia Rouelli Sabino et al., Influence of Ta insertions on the magnetic properties of MgO/CoFeB/MgO films probed by ferromagnetic resonance, Japan Society of Applied Physics, 2014.

D. C. Worledge et al., Spin torque switching of perpendicular Ta CoFeB MgO-based magnetic tunnel junctions, 2011, Applied Physics Letter 98, 022501, USA.

Matthias Gottwald et al., ParamagneticFexTa1-x alloys for engineering of perpendicularly magnetized tunnel junctions, APL Materials, 2013, vol. 1, Issue 2, USA.

Lea Cuchet et al., Influence of a Ta spacer on the magnetic and transport properties of perpendicular magnetic tunnel junctions, 2013, Applied Physics Letters 103, 052402, AIP Publishing.

T. Liu et al., "Thermally robust Mo/CoFeB/MgO trilayers with strong perpendicular magnetic anisotropy", Scientific Reports, 2014.

Di Wu et al., "Enhancement of perpendicular magnetic anisotropy in Co/Ni multilayers by in situ annealing the Ta/Cu under-layers", Applied Physics Letters, 2013, vol. 103, No. 24, AIP Publishing.

H. Kurt et al., "Enhanced perpendicular magnetic anisotropy in Co/Ni multilayers with a thin seed layer", Journal of Apllied Physics, 2010, vol. 108, No. 7, AIP Publishing.

L. You et al., "Co/Ni multilayers with perpendicular anisotropy for spintronic device applications", 2012, Applied Physics Letter, vol. 100, No. 172411, American Institute of Physics.

S. Ikeda et al., "A Perpendicular-anisotropy CoFeB—MgO Magnetic Tunnel Junction", Nature Materials, Sep. 2010, pp. 721-724, vol. 9, Macmillan Publishers Limited, part of Springer Nature.

H. Sato et al., "Comprehensive Study of CoFeB—MgO Magnetic Tunnel Junction Characteristics with Single- and Double-interface Scaling Down to 1X nm", Electron Devices Meeting (IEDM), Jan. 2014, pp. 13-60-13-63, IEEE.

H. X. Yang et al., "First-principles Investigation of the Very Large Perpendicular Magnetic Anisotropy at Fe|MgO and Co|MgO Interfaces", Physical Review B, Aug. 2011, pp. 054401-1-054401-5, vol. 84, No. 5, American Physical Society.

Woojin Kim et al., "Extended Scalability of Perpendicular STT-MRAM towards Sub-20nm MTJ Node", Conference Paper in Electron Devices Meeting (IEDM) Technical Digest. International, Dec. 2011, pp. 11-531-11-534, IEEE International.

G. S. Kar et al., Co/Ni Based p-MTJ Stack for Sub-20nm High Density Stand Alone and High Performance Embedded Memory Application, IEEE International Electron Devices Meeting (IEDM), 2014, pp. 1-4, IMEC Leuven, Belgium.

Chaelyoung Kim et al., Bottom Electrode Surface Treatment Effect on MTJ in MRAM Device, Honolulu PRiMe, 2012, Abstract #2502, The Electrochemical Society, Honolulu, Hawaii.

Luc Thomas et al., Perpendicular Spin Transfer Torque Magnetic Random Access Memories with High Spin Torque Efficiency and Thermal Stability for Embedded Applications (invited), Article in Journal of Applied Physics, Apr. 2014, pp. 172615-172615-6, vol. 115, No. 17, AIP Publishing LLC.

Cheng-Wei Chien et al., Scaling Properties of Step-Etch Perpendicular Magnetic Tunnel Junction With Dual-CoFeB/MgO Interfaces, IEEE Electron Device Letters, Jul. 2014, pp. 738-740, vol. 35, No. 7, IEEE.

Chinese Intellectual Property Office, Office Action issued in Chinese Patent Application No. 201610951918.3 dated Nov. 5, 2018.

* cited by examiner

COMPOSITE SPACER LAYER FOR MAGNETORESISTIVE MEMORY

CROSS-REFERENCE TO RELATED APPLICATIONS

This application claims the priority of U.S. Provisional Application No. 62/249,378, entitled "Magnetic Tunnel Junction with High Thermal Budget" filed on Nov. 2, 2015, and U.S. Provisional Application No. 62/325,986, entitled "Perpendicular MTJ Stack with High TMR and High Thermal Endurance and Method for Forming Thereof" filed on Apr. 21, 2016, which are herein incorporated by reference in its entirety. This application also cross-references U.S. patent application Ser. No. 15/057,109, entitled "Magnetic Memory with High Thermal Budget" filed on Feb. 29, 2016; U.S. patent application Ser. No. 15/060,634, entitled "Magnetic Memory with Tunneling Magnetoresistance Enhanced Spacer Layer" filed on Mar. 4, 2016; patent application Ser. No. 15/071,180, entitled "High Thermal Budget Magnetic Memory" filed on Mar. 15, 2016; U.S. patent application Ser. No. 15/075,222, entitled "Bottom Electrode for Magnetic Memory to Increase TMR and Thermal Budget" filed on Mar. 21, 2016; U.S. patent application Ser. No. 15/081,971, entitled "Storage Layer for Magnetic Memory with High Thermal Stability" filed on Mar. 28, 2016; U.S. patent application Ser. No. 15/060,647, entitled "Magnetic Memory with Tunneling Magnetoresistance Enhanced Spacer Layer" filed on Mar. 4, 2016; and U.S. patent application Ser. No. 15/057,107, entitled "Magnetic Memory with High Thermal Budget" filed on Feb. 29, 2016; which are herein incorporated by references for all purposes.

BACKGROUND

A magnetic memory cell or device stores information by changing electrical resistance of a magnetic tunnel junction (MTJ) element. The MTJ element typically includes a thin insulating tunnel barrier layer sandwiched between a fixed ferromagnetic layer and a free ferromagnetic layer, forming a magnetic tunnel junction. The resistance state of the MTJ element changes corresponding to that of the magnetic orientation of the free layer relating to the fixed layer, which may be in either a parallel (P) state or an anti-parallel (AP) state. The corresponding electrical resistance between the free layer and the fixed layer in P state is denoted as $R_P$ while the corresponding electrical resistance between the free layer and the fixed layer in AP state is denoted as $R_{AP}$. The performance of an MTJ element is usually characterized by its tunneling magnetoresistance (TMR), which may be calculated using the formula given by $(R_{AP}-R_P)/R_P$. For example, a larger TMR ratio facilitates read operations in a magnetic memory cell. Thus, an enhanced TMR is necessary for realizing next-generation magnetic memory cells.

It is desirable to provide a reliable memory device with an enhanced TMR ratio and a method for forming a reliable memory device which eliminates the high temperature concern for the MTJ element. Furthermore, it is also desirable that the process is cost effective and is compatible with logic processing.

SUMMARY

Embodiments of the present disclosure generally relate to semiconductor devices and methods for forming a semiconductor device. One embodiment relates to a method of forming a device. The method includes providing a substrate having circuit component formed on its surface. Back-end-of-line (BEOL) processing is performed to form an inter level dielectric (ILD) layer over the substrate. The ILD layer includes a plurality of ILD levels. A magnetic tunneling junction (MTJ) stack is formed in between adjacent ILD levels of the ILD layer. The MTJ stack includes a magnetic fixed layer which includes a synthetic antiferromagnetic (SAF) layer, a composite spacer layer disposed on the SAF layer and a reference layer on the composite spacer layer. The composite spacer layer includes a first non-magnetic (NM) spacer layer, a magnetic (M) spacer layer disposed over the first NM spacer layer and a second NM spacer layer disposed over the M layer. A tunneling barrier layer disposed over the magnetic fixed layer. A magnetic free layer is disposed over the tunneling barrier layer.

Another embodiment relates to a method of forming a device. The method includes providing a substrate having circuit component formed on its surface. Back-end-of-line (BEOL) processing is performed to form an inter level dielectric (ILD) layer over the substrate. The upper ILD layer includes a plurality of ILD levels. A magnetic tunneling junction (MTJ) stack is formed in between adjacent ILD levels of the ILD layer. The MTJ stack includes a bottom electrode with a seed layer thereon. A magnetic fixed layer is disposed on the seed layer. The magnetic fixed layer includes a synthetic antiferromagnetic (SAF) layer, a composite spacer layer disposed on the SAF layer and a reference layer on the composite spacer layer. The composite spacer layer includes a first non-magnetic (NM) spacer layer, a magnetic (M) spacer layer disposed over the first NM spacer layer and a second NM spacer layer disposed over the M layer. A tunneling barrier layer disposed over the magnetic fixed layer. A magnetic free layer is disposed over the tunneling barrier layer. A cap layer is disposed on the magnetic free layer. A top electrode is over the cap layer.

Another embodiment relates to a device. The device includes a substrate having circuit component formed on its surface. An inter level dielectric (ILD) layer is disposed over the substrate. The ILD layer includes a plurality of ILD levels. A magnetic tunneling junction (MTJ) stack is disposed in between adjacent ILD levels of the ILD layer. The MTJ stack includes a magnetic fixed layer which includes a synthetic antiferromagnetic (SAF) layer, a composite spacer layer disposed on the SAF layer and a reference layer on the composite spacer layer. The composite spacer layer includes a first non-magnetic (NM) spacer layer, a magnetic (M) spacer layer disposed over the first NM spacer layer and a second NM spacer layer disposed over the M layer. A tunneling barrier layer disposed over the magnetic fixed layer. A magnetic free layer is disposed over the tunneling barrier layer.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments of the present disclosure generally relate to memory cells or devices. In one embodiment, the memory cells are magnetoresistive memory cells. For example, the memory devices may be spin transfer torque magnetoresistive random access memory (STT-MRAM) devices. Other types of memory devices may also be useful. A magnetoresistive memory cell includes a magnetic tunneling junction (MTJ) storage unit. The MTJ storage unit of the present disclosure includes a composite spacer layer that provides sustainable or enhanced TMR at high annealing temperature, for example, 400° C. during back-end-of-line (BEOL) processing. Other suitable types of memory cells may also be useful. Such memory devices, for example, may be incorporated into standalone memory devices including, but not limited to, USB or other types of portable storage units, or ICs, such as microcontrollers or system on chips (SoCs). The devices or integrated circuits (ICs) may be incorporated into or used with, for example, consumer electronic products, or relate to other types of devices.

Figure 1:
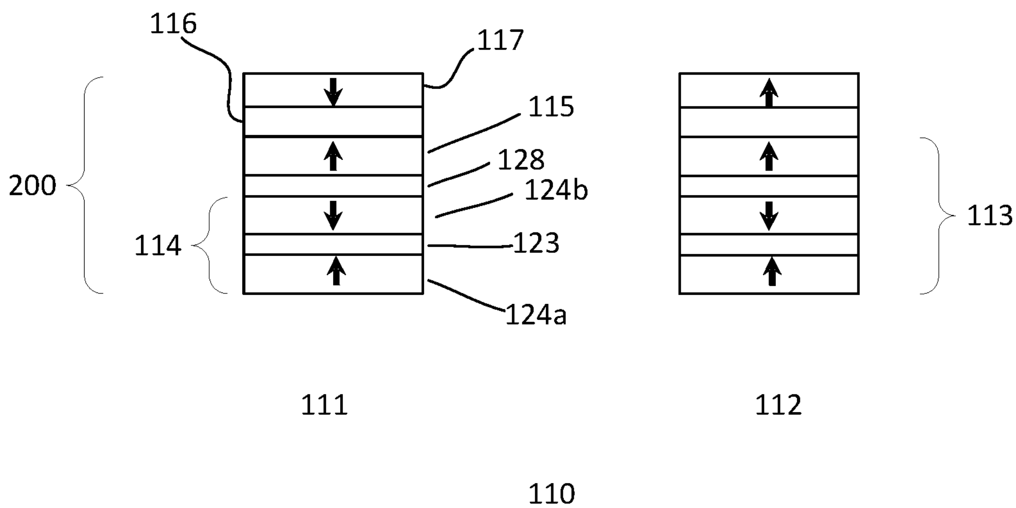
FIG. 1 shows simplified diagrams of parallel state and anti-parallel state of a bottom pinned perpendicular MTJ module of a magnetic memory cell.

FIG. 1 shows simplified cross-sectional views of parallel state and anti-parallel state of a bottom pinned perpendicular MTJ (pMTJ) element or stack 200 of a magnetic memory cell. The MTJ stack may be disposed between bottom and top electrodes (not shown). The bottom electrode may be proximate to the substrate on which the memory cell is formed while the top electrode may be distal from the substrate. The electrodes may be tantalum-based (Ta-based) or titanium-based (Ti-based) electrodes. For example, the electrodes may be Ta, tantalum nitride (TaN), Ti or titanium nitride (TiN). In one embodiment, the bottom electrode may be a TaN electrode while the top electrode may be a Ta electrode. Other types or configurations of electrodes may also be useful.

The MTJ element includes a magnetically fixed layer 113, a tunneling barrier layer 116 and a magnetically free layer 117. In one embodiment, the magnetically fixed layer 113 is disposed below the magnetically free layer 117, forming a bottom pinned pMTJ stack. The magnetic orientation or magnetization of the fixed layer 113 is fixed or pinned in a first perpendicular direction. The term perpendicular direction, for example, refers to the direction of the magnetic field which is perpendicular to the surface of a substrate or perpendicular to the plane of the layers of the MTJ module.

The magnetic fixed layer includes a synthetic antiferromagnetic (SAF) layer. The SAF layer includes first and second magnetic layers 124*a* and 124*b* separated by an exchange coupler layer 123. The first and second magnetic layers of the SAF layer have opposite directions of magnetization. A reference layer 115 is disposed over the SAF layer. The reference layer and the SAF layer are separated by a spacer layer 128. As shown, the reference layer has a magnetization which is fixed in the first magnetic direction. The reference layer, for example, defines the magnetic direction of the fixed layer. The SAF layer, for example, pins the magnetization of the reference layer in the first magnetic direction.

As shown, the first perpendicular direction is in an upward direction away from the electrode. Providing the first perpendicular direction which is in a downward direction towards the electrode may also be useful. As for the magnetic orientation or magnetization of the free layer 117, it may be programmed to be in a first or same direction as the fixed layer 113 or in a second or opposite direction as the fixed layer 113.

For example, as shown by structure 111, the magnetic orientation or magnetization of the free layer 117 is programmed to be in the second or anti-parallel direction to the fixed layer 113. The corresponding MTJ electrical resistance between the free layer 117 and the fixed layer 113 is denoted as $R_{AP}$. Structure 112 illustrates that the magnetic orientation of the free layer 117 is programmed to be in the first or parallel direction to the fixed layer 113. The corresponding MTJ electrical resistance between the free layer 117 and the fixed layer 113 is denoted as $R_P$. The resistance $R_{AP}$ is higher than the resistance $R_P$.

Figure 2:
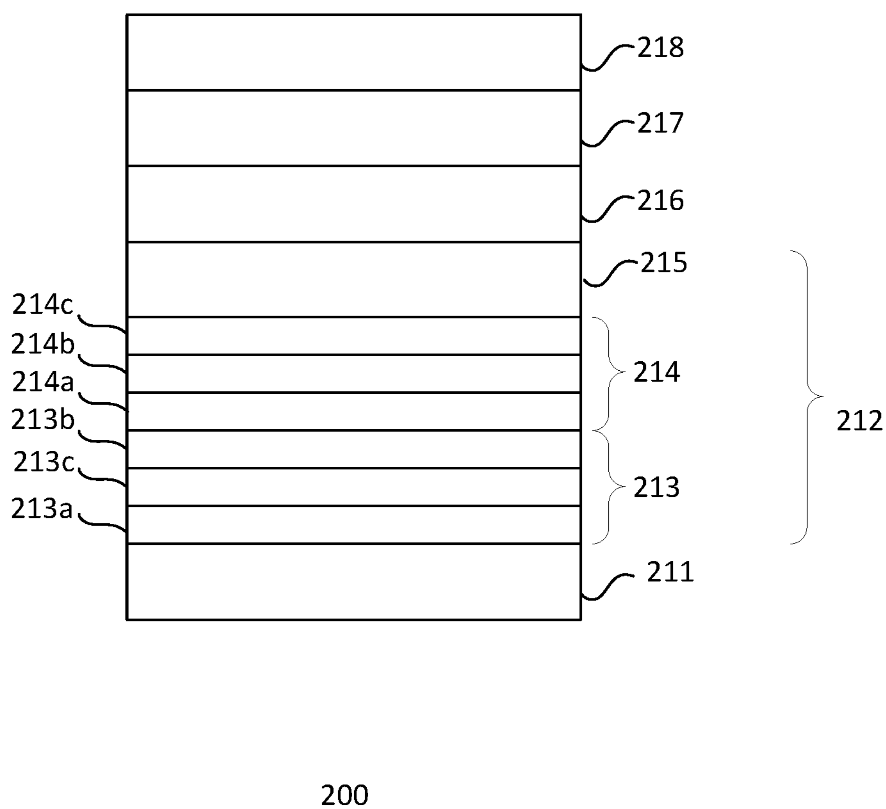
FIG. 2 shows a cross sectional view of an embodiment of a perpendicular MTJ element of a magnetic memory cell.

FIG. 2 shows a simplified cross-sectional view of an embodiment of a pMTJ element or stack 200 of FIG. 1. The cross-sectional view, for example, is along a bitline direction (x-axis). The pMTJ stack 200 is a stack of layers. As shown, the pMTJ stack may include a seed layer 211, a fixed layer 212, a tunneling barrier layer 216, a magnetically free layer 217 and a cap layer 218. The fixed layer, for example, includes a synthetic antiferromagnetic (SAF) layer 213, a spacer layer 214 and a polarizer or reference layer (RL) 215. The layers forming the pMTJ stack are sequentially formed on the seed layer 211. The seed layer 211, for example, enables a smooth and densely packed growth of the subsequently formed layers. The seed layer 211 may be a metal layer, for example, tantalum (Ta), platinum (Pt), ruthenium (Ru), iron-nickel (NiFe) or nickel-chromium (NiCr).

As shown, the SAF layer 213 is disposed on the seed layer. The SAF layer may include a first magnetic layer 213*a*, a second magnetic layer 213*b* and an exchange coupling layer 213*c*. The first and second magnetic layers have opposite directions of magnetization and are separated by the coupling layer 213*c*. The first magnetic layer may be referred to as a first antiparallel layer (AP1) or first hard layer (HL1) and the second magnetic layer may be referred to as a second antiparallel layer (AP2) or second hard layer (HL2). The first magnetic layer 213*a*, for example, is disposed on the seed layer 211. The coupling layer 213*c* is disposed on the first magnetic layer 213*a* and the second magnetic layer 213*b* is disposed on the coupling layer 213*c*. The purpose of the SAF layers is to minimize the stray field arising from AP1 and AP2 through the free layer 217. This maintains higher data retention. As a result, stray magnetic field influences on the free layer 217 are minimized.

The magnetizations of the first and second magnetic layers are “pinned” via the exchange coupling layer 213*c*. The magnetization or magnetic orientation in the second magnetic layer 213*b* which is proximate to the free layer 217 acts as a fixed reference to the free layer 217.

The first magnetic layer 213*a* and the second magnetic layers 213*b* of the SAF layer 213 may be an alloy magnetic layer or a multilayer. For example, a magnetic layer may be a cobalt-iron-boron (CoFeB) alloy, a cobalt-iron (CoFe) alloy, or a platinum (Pt) alloy. The magnetic layer, for example, may be Co(Fe,Ni)Pt/Pd or CoPt or FePt. In other cases, the magnetic layer may be a multilayer of cobalt/platinum $(Co/Pt)_n$, cobalt/palladium $(Co/Pd)_m$ or cobalt/nickel $(Co/Ni)_x$. The first magnetic layer 213*a* may be thicker than the second magnetic layer 213*b*. For example, the first magnetic layer 213*a* may include n layer(s) of Co/Pt, Co/Pd or Co/Ni, and the second magnetic layer 213*b* may include m layer(s) of Co/Pt, Co/Pd or Co/Ni, wherein n is larger than m. In one embodiment, n and m may be less than 20 layers. The first magnetic layer may be referred to as a first anti-parallel (AP1) layer and the second magnetic layer may be referred to as a second anti-parallel (AP2) layer.

In one embodiment, the first and second magnetic layers of the SAF layer 213 may be arranged in the (111) orientation of a face centered cubic (fcc) lattice structure. Other fcc orientations of the first and second magnetic layers of the SAF layer 213 may also be useful. As for the coupling layer 213*c*, it may be a non-magnetic conductor layer. For example, the coupling layer 213*c* may be a ruthenium (Ru) layer. The Ru layer may be sufficiently thin. For example, the coupling layer may be about 4-9 Å thick. Preferably, the coupling layer is about 4 Å thick. Other thicknesses may also be useful. A thin coupling layer facilitates maximizing the exchange coupling field through the first peak of the coupling layer, such as Ru.

As for the spacer layer 214, it is disposed on the SAF layer 213. The spacer layer 214 may be a composite spacer. In one embodiment, the composite spacer layer includes multiple layers. The composite spacer layer includes non-magnetic (NM) and magnetic (M) layers. In one embodiment, the composite spacer layer includes a M layer 214*b* sandwiched between two NM layers 214*a* and 214*b*. The first NM layer 214*a* may be referred to as a base layer (BL). For example, the composite spacer layer may be a BL/M/NM composite layer. In other embodiments, the composite spacer layer may include a BL 214*a* and a plurality of M/NM bilayers 214*b* and 214*c*. For example, the composite spacer layer may be a $(BL)(M/NM)_n$ composite layer, where n is ≥1 and is the number of M/MN bilayers.

In one embodiment, the B layer is proximate to the SAF layer 213, whereas the M spacer layer 214*b* is distal from the SAF layer 213. The M layer is magnetically coupled to the AP2 layer through the layer 214*a*. In one embodiment, the NM layer 214*c* serves as a template enhancer for the polarizer layer. Enhancing the template of the polarizer layer facilitates strong tunneling effect through the tunnel barrier layer 216 and hence, improves the TMR. In addition, the M spacer layer serves as a diffusion barrier. For example, the M spacer layer prevents or reduces diffusion of atoms from the NM spacer layer below to the polarizer layer and the tunneling barrier layer. Furthermore, the use of multiple NM spacer layers separated by at least one M layer reduces the thickness of the NM layers. This also results in reduced diffusion of atoms from the NM spacer to the polarizer layer and the tunneling barrier layer.

The NM layers, including the B layer, may be NM metal layers. In one embodiment, a metal NM layer may be, for example, tantalum (Ta), molybdenum (Mo), tungsten (W), niobium (Nb), ruthenium (Ru), titanium (Ti) or a combination thereof. In a preferred embodiment, a NM spacer layer is a Ta layer. In one embodiment, a NM spacer layer may be an amorphous layer. The thickness of the NM spacer layer should be sufficiently thin to maintain coupling between RL and AP2. The thickness of the NM spacer layer may be, for example, about 0.5-5 Å and preferably about 0.5-4 Å. Other thicknesses may also be useful. The thickness, for example, may depend on the desired coupling strength.

As for a M spacer layer 214*b*, it may be a Co-based magnetic layer. The Co-based M layer may be a composite M layer with different compositions. In one embodiment, a Co-based M spacer layer is a Co(Fe, Ni)$B_x$. In a preferred embodiment, the M layer is a CoFeB layer. The M spacer layer is a magnetically continuous amorphous layer. For example, the Co-based layer is a magnetically continuous amorphous layer. To facilitate an amorphous layer, the boron (B) concentration of the Co(Fe, Ni)$B_x$ layer may be and preferably from about 0-40%. As for the concentration of Co of the Co(Fe, Ni)$B_x$ layer, it may vary from about 20-60% The M spacer layer may, in one embodiment, be a monolayer. The M spacer monolayer may be a discontinuous layer, which is loosely packed on the surface of the first spacer layer 214*a*. The discontinuous second layer 214*b* allows diffusion of B towards the first spacer layer 214*a* so that B can be absorbed by the NM spacer layer or layers. The thickness of the M layer should maintain the perpendicular magnetic anisotropy (PMA) of the RL and AP2 layer. For example, the thickness of the M layer may be about 1.0-13 Å and preferably be about 1.0-13 Å. Other thicknesses may also be useful.

In the case where n is greater than one, thinner NM and M layers may be employed. This improves over surface smoothness of the spacer layer and improves coupling to RL as well as enhancing the polarization of RL. This also increases or maximizes the TMR of the MTJ element.

In some embodiments, the different M and NM layers of the spacer layer may be of the same type. For example, the M layers are the same type of M layers and NM layers are of the same type of NM layers. In other embodiments, different M and NM layers may be different types of N and MN layers or a combination of same and different types of layers.

As described, the composite spacer layer 214 is as follows:

$$\text{Spacer layer}=(BL)/(M/NM)_n,$$

where

BL is the base layer and is a non-magnetic (NM) metal layer,

M/NM is the bilayer in which

M is a magnetic layer of the bilayer, and

NM is a non-magnetic metal layer of the bilayer, and n is the number of bilayers and is ≥1.

In one embodiment, n is from 1 to 5. Providing other numbers of bilayers may also be useful.

In one embodiment, the NM layers of the composite spacer include Ta and the M layers include CoFeB. For example, the composite spacer layer may be $Ta/(CoFeB/Ta)_n$, wherein n is from 1 to 5. The thickness of the NM layers may be about 1 Å while the thickness of the M layers is about 2 Å. Other types and thicknesses of composite spacer layers may also be useful.

In one embodiment, the NM and M spacer layers may be formed by sputtering using separate sputtering processes. In other embodiments, the NM and M spacer layers may be formed by an alloy target including both materials of the NM and M spacer layers. For example, the spacer layers may be formed by co-sputtering. In the case of a Ta/CoFeB/Ta spacer layer, a TaCoFeB alloy target may be used. In one embodiment, the first Ta spacer layer is formed having a thickness of about 0.5-5 Å using Krypton (Kr) gas at 75 W.

Alternatively, the first Ta spacer layer may be formed using Xenon (Xe) gas at 75 W. As for the CoFeB second spacer layer, it is formed with a thickness of about 1.0-13 Å using Argon (Ar) gas at 600 W.

The spacer layer 214 governs the growth of the subsequently formed layer. For example, the amorphized first spacer layer 214*a*, such as Ta, breaks the texture from underneath, for example, the crystallinity of the polarizer layer.

The spacer layer 214 enables the growth of an amorphous layer. Therefore, the subsequently formed layer, e.g., the polarizer layer, is highly disordered, resulting in an enhanced TMR.

The polarizer layer 215 is disposed on the spacer layer 214. The polarizer layer 215 is an amorphous layer. In one embodiment, the polarizer layer 215 may be an amorphized CoFeB layer. The amorphous layer enhances the tunnel magnetoresistance (TMR) effect of the MTJ stack.

The tunneling barrier layer 216 is disposed on the polarizer layer 215. The tunneling barrier layer 216 is a non-magnetic and electrically insulating layer. The tunneling barrier layer 216 may be a metal oxide layer, for example, a crystalline magnesium oxide (MgO) or an amorphous aluminum oxide ($Al_2O_3$). Other metal oxides suitable for used as the tunneling barrier layer in the MTJ element may also be useful.

The magnetic free layer 217 is disposed on the tunneling barrier layer 216. The magnetic free layer 217 may be a CoFeB layer. The cap layer 218 is disposed on the free layer 217. The cap layer 218 may be made of Pt, Ru, Ta or other suitable metals. The cap layer 218 protects the underlying free layer 217 and promotes the perpendicular magnetic anisotropy (PMA) in the free layer 217.

As described, the MTJ stack includes a single tunneling barrier layer 216 disposed between the reference layer 215 and magnetic free layer 217. In other embodiments, the MTJ stack may include dual tunneling barrier layers. For example, a first barrier layer 216 may be disposed between the reference layer 215 and magnetic free layer 217 and a second barrier layer (not shown) between the free layer 217 and cap layer 218. Other configurations of tunneling barrier layers may also be useful.

Figure 3:
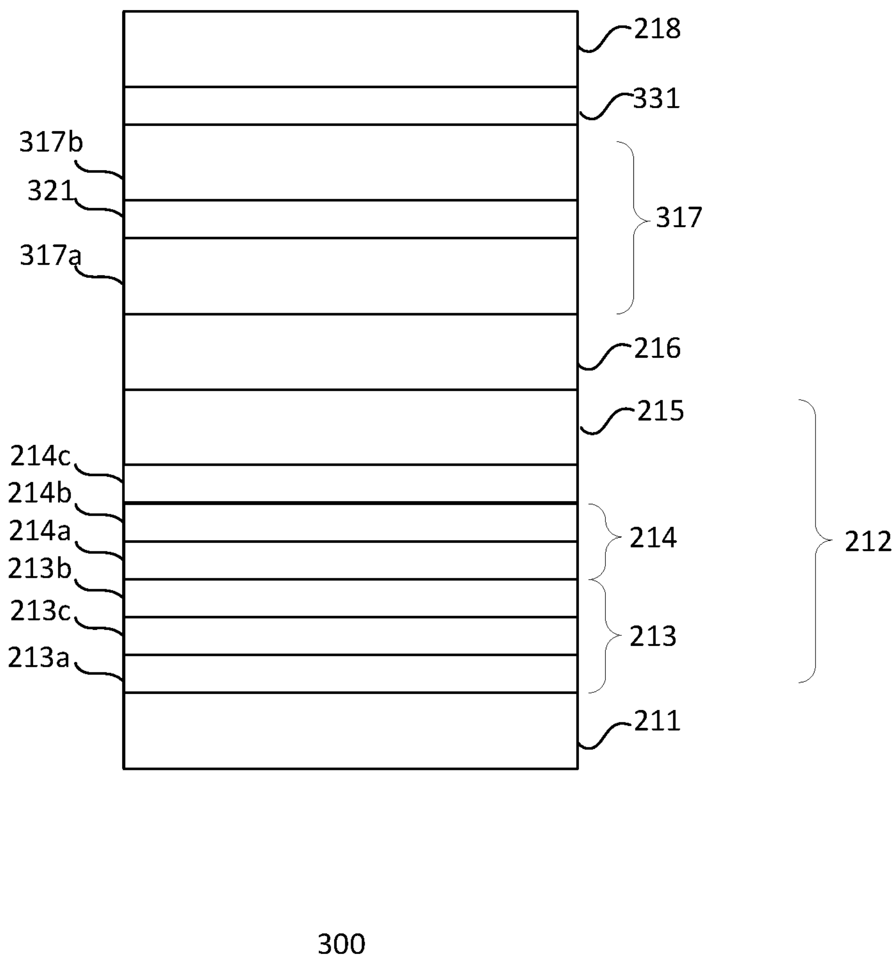
FIG. 3 shows a cross sectional view of an embodiment of a perpendicular MTJ element of a magnetic memory cell.

In another embodiment, as shown in FIG. 3, the magnetic stack 300 includes a magnetic free layer which is a composite free layer 317 including CoFeB. The magnetic stack is similar to that described in FIG. 2. Common elements may not be described or described in detail. The composite layer may include a mono coupling stack. The mono coupling stack includes a coupling layer 321 sandwiched between two magnetic layers 317*a* and 317*b*. For example, the mono coupling stack includes the following configuration:

magnetic layer/coupling layer/magnetic layer.

In one embodiment, the magnetic layers may be CoFeB. Other types of magnetic layers may also be useful. The magnetic layers of the coupling stack preferably are the same material. However, it is understood that the magnetic layers of the coupling stack need not be the same. In one embodiment, the coupling layer may be similar to the spacer layer 214 of the magnetic fixed layer. Other types of coupling layers may also be useful. For example, the coupling layer may be a NM metal layer, similar to that of the NM metal layer 214*a* or 214*c* of the composite spacer layer 214.

In one embodiment, a tunneling barrier layer 331, similar to the tunneling barrier 216, is disposed on the dual coupling stack while the cap layer 218 is disposed on the tunneling barrier layer. For example, the MTJ stack is a dual tunneling barrier MTJ stack. Providing a single tunneling barrier MTJ stack may also be useful.

Figure 4:
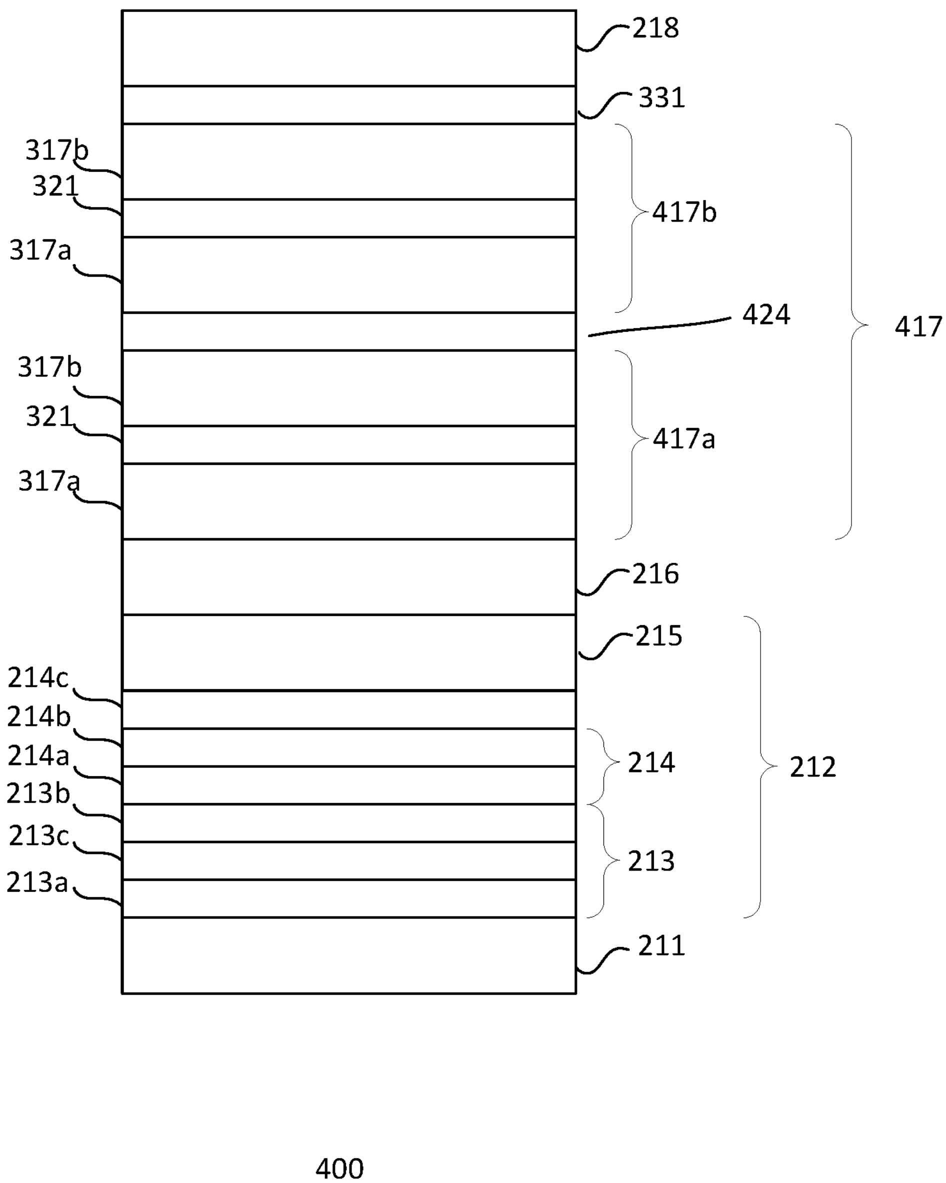
FIG. 4 shows a cross sectional view of an embodiment of a perpendicular MTJ element of a magnetic memory cell.

In yet another embodiment, as shown in FIG. 4, the magnetic stack 400 includes a magnetic free layer, i.e., a composite free layer 417 having multiple coupling stacks. The magnetic stack is similar to that described in FIGS. 2 and 3. Common elements may not be described or described in detail. As shown, the magnetic free layer includes first and second coupling stacks 417*a* and 417*b* separated by a coupling layer 424. This, for example, forms a dual coupling stack composite free layer. A coupling stack, for example, is similar to the mono coupling stack, as described in FIG. 3. Common elements will not be described or described in detail. The thickness of the magnetic layers in the dual coupling stack may be substantially the same as the mono coupling stack, whereas the coupling layer may be a thin layer that suffices for coupling the magnetic layers. The coupling layer between the coupling stacks may be similar to the coupling layer of a coupling stack. Other numbers of coupling stacks may also be useful to provide a composite free layer.

The composite free layer serves as a magnetic dilution layer for enhancing the perpendicular magnetic anisotropy (PMA) as well as reducing the switching current. Furthermore, the composite free layer also improves the 400° C. thermal budget performance and enables pMTJ process to be compatible with complementary metal oxide semiconductor (CMOS) BEOL process.

For the dual coupling stack, a tunneling barrier layer 331, similar to the tunneling barrier 216, is disposed on the dual coupling stack while the cap layer 218 is disposed on the tunneling barrier layer. For example, the MTJ stack is a dual tunneling barrier MTJ stack. Providing a single tunneling barrier MTJ stack may also be useful.

Figure 5:
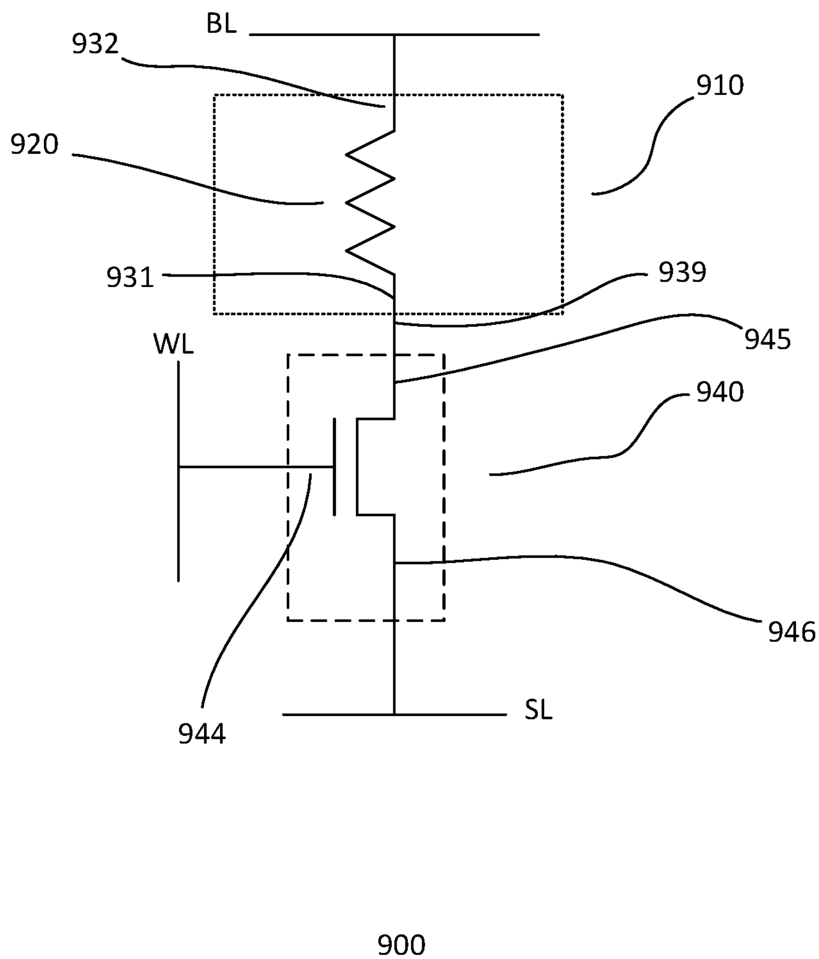
FIG. 5 shows a schematic diagram of an exemplary embodiment of a magnetic memory cell.

FIG. 5 shows a schematic diagram of an embodiment of a memory cell 900. The memory cell is a non-volatile memory (NVM) cell. For example, the memory cell may be a magnetoresistive memory cell. In one embodiment, the memory cell is a Spin Transfer Torque-Magnetoresistive Random Access Memory (STT-MRAM) cell. Other suitable types of memory cells may also be useful. The memory cell includes a storage unit 910 and a cell selector unit 940. The storage unit 910 is coupled to the cell selector unit 940. For example, the storage unit 910 and the cell selector unit 940 are coupled at a first cell node 939 of the memory cell. The storage unit 910, in one embodiment, is a magnetic storage unit and includes a pMTJ element 920. The pMTJ element may be the same or similar to those described in FIGS. 2 to 4. Other suitable types of MTJ elements may also be useful.

The pMTJ element includes first and second electrodes 931 and 932. The first electrode 931, for example, may be a bottom electrode while the second electrode 932 may be a top electrode. Other configurations of electrodes may also be useful. In one embodiment, the top electrode 932 of the storage unit 910 is electrically connected to a bit line (BL). The bottom electrode 931 of the storage element is connected to the first cell node 939.

The cell selector unit 940 includes a selector for selecting the memory cell. The selector, for example, may be a select transistor. In one embodiment, the select transistor is a metal oxide semiconductor (MOS) transistor. In one embodiment, the selector is a n-type MOS transistor. The select transistor includes first and second source/drain (S/D) terminals 945 and 946 and a gate or control terminal 944. The S/D terminals, for example, are heavily doped regions with first polarity type dopants, defining the first type transistor. For example, in the case of a n-type transistor, the S/D terminals are n-type heavily doped regions. Other types of transistors or selectors may also be useful.

In one embodiment, the first terminal of the cell selector and the first electrode 931 of the storage unit 910 are commonly coupled at the first cell node 939. For example, the first S/D terminal 945 of the cell selector is coupled to the bottom electrode 931 of the storage unit 910. The second terminal 946 of the cell selector is coupled to a source line (SL). As for the gate terminal 944, it is coupled to a wordline (WL).

Figure 6:
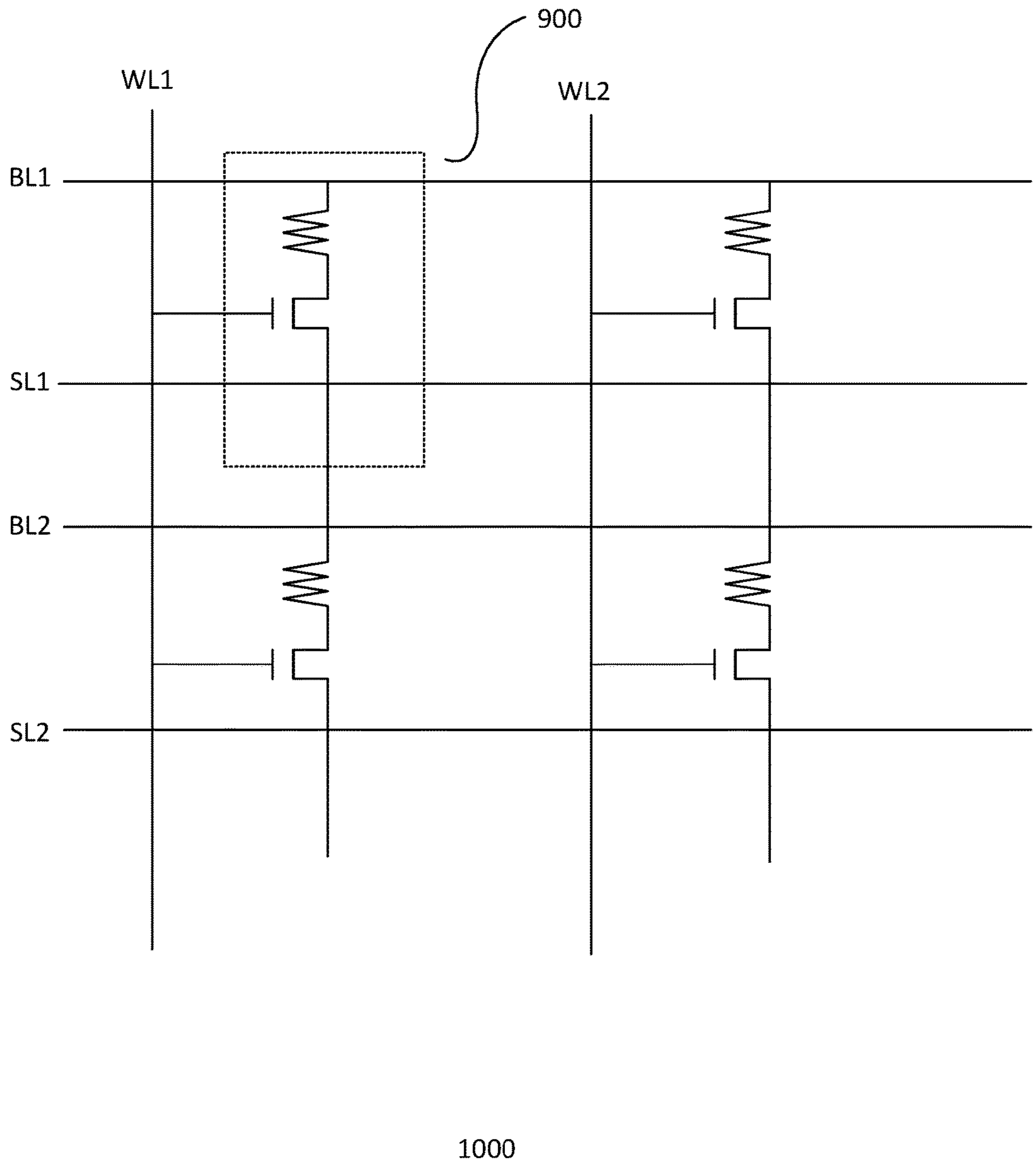
FIG. 6 shows a schematic diagram of an exemplary array of magnetic memory cells.

FIG. 6 shows a schematic diagram of an embodiment of a memory array 1000. The array includes a plurality of memory cells 900 interconnected. The memory cells may be similar to the memory cell described in FIG. 5. For example, the memory cells are MRAM cells, such as STT-MRAM cells. Common elements may not be described or described in detail. Other suitable types of memory cells may also be useful.

As shown, the array includes four memory cells arranged in a 2×2 array. For example, the array is arranged to form two rows and two columns of memory cells. Memory cells of a row are interconnected by a wordline (WL1 or WL2) while memory cells of a column are interconnected by a bitline (BL1 or BL2). A S/D terminal is coupled to a source line (SL1 or SL2). Other suitable cell configurations may also be useful. Although the array is illustrated as a 2×2 array, it is understood that arrays of other sizes may also be useful.

Figure 7:
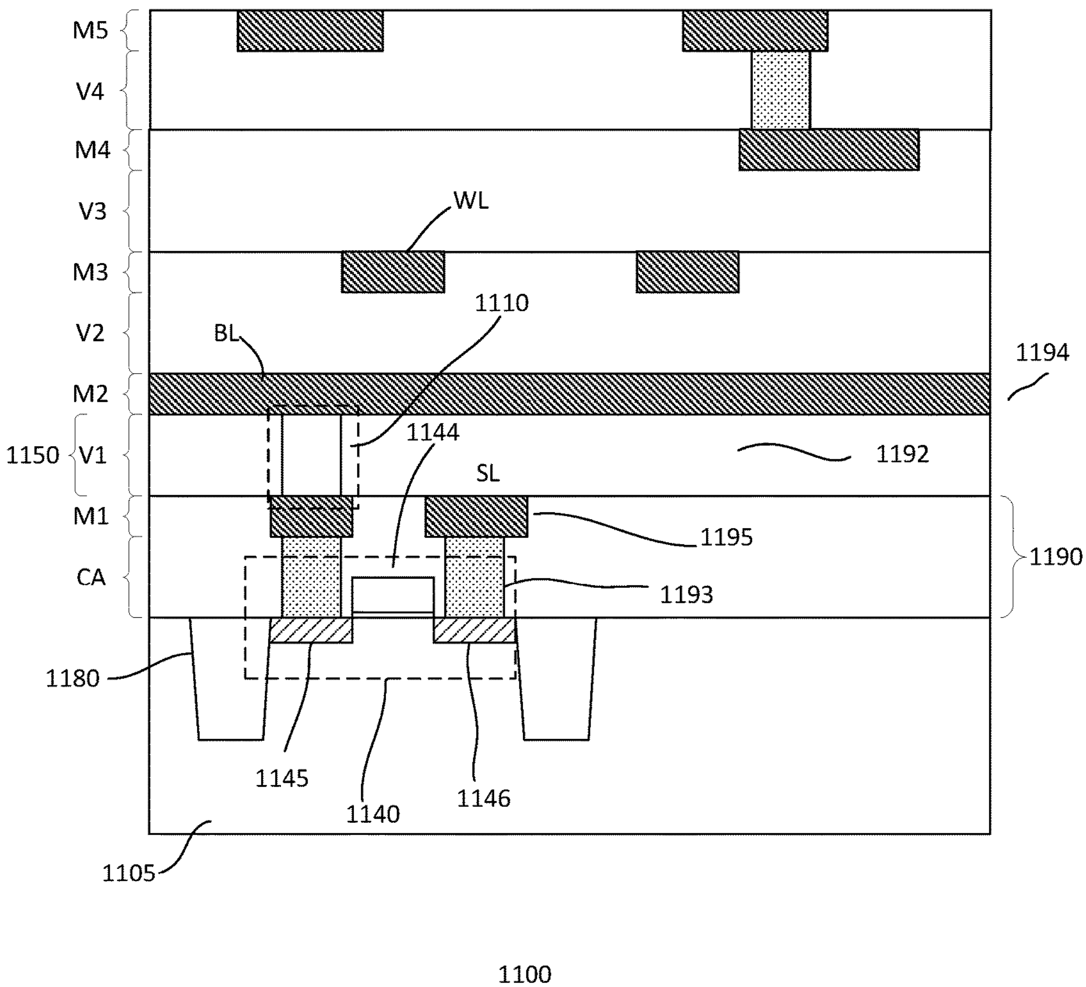
FIG. 7 shows a cross-sectional view of an embodiment of a device.

FIG. 7 shows a cross-sectional view of an exemplary embodiment of a memory cell 1100 of a device. The cross-sectional view, for example is along a second or bitline direction of the device. The device, as shown, includes a memory cell 1100. The memory cell, for example, may be a NVM memory cell. The memory cell, in one embodiment, is a magnetoresistive NVM cell, such as a STT-MRAM cell. The memory cell, for example, includes a pMTJ stack which is the same or similar to those described in FIGS. 2 to 4. Common elements may not be described or described in detail.

The memory cell is disposed on a substrate 1105. For example, the memory cell is disposed in a cell region of the substrate 1105. The cell region may be part of an array region. For example, the array region may include a plurality of cell regions. The substrate 1105 may include other types of device regions (not shown), such as high voltage (HV) as well as logic regions, including low voltage (LV) and intermediate voltage (IV) device regions. Other types of regions may also be provided.

The substrate 1105, for example, is a semiconductor substrate, such as a silicon substrate. For example, the substrate 1105 may be a lightly doped p-type substrate. Providing an intrinsic or other types of doped substrates, such as silicon-germanium (SiGe), germanium (Ge), gallium-arsenic (GaAs) or any other suitable semiconductor materials, may also be useful. In some embodiments, the substrate 1105 may be a crystalline-on-insulator (COI) substrate. A COI substrate includes a surface crystalline layer separated from a crystalline bulk by an insulator layer. The insulator layer, for example, may be formed of a dielectric insulating material. The insulator layer, for example, is formed from silicon oxide, which provides a buried oxide (BOX) layer. Other types of dielectric insulating materials may also be useful. The COI substrate, for example, is a silicon-on-insulator (SOI) substrate. For example, the surface and bulk crystalline layers are single crystalline silicon. Other types of COI substrates may also be useful. It is understood that the surface and bulk layers need not be formed of the same material.

Front-end-of-line (FEOL) processing is performed on the substrate 1105. The FEOL process, for example, forms n-type and p-type devices or transistors on the substrate 1105. The p-type and n-type device form a complementary MOS (CMOS) device. The FEOL processing, for example, includes forming isolation regions, various device and isolation wells, transistor gates and transistor source/drain (S/D) regions and contact or diffusion regions serving as substrate or well taps. Forming other components with the FEOL process may also be useful.

Isolation regions 1180, for example, serve to isolate different device regions. The isolation regions may be shallow trench isolation (STI) region. To form STI regions, trenches are formed and filled with isolation material. A planarization process, such as chemical mechanical polishing (CMP) is performed to remove excess dielectric material, forming isolation regions. Other types of isolation regions may also be useful. The isolation regions are provided to isolate device regions from other regions.

Device wells (not shown), for example, serve as bodies of p-type and n-type transistors. Device wells are doped wells. Second type doped device wells serve as bodies of first type transistors. For example, p-type device wells serve as bodies of n-type transistors and n-type device wells serve as bodies of p-type transistors. Isolation wells may be used to isolate device wells from the substrate. The isolation wells are deeper than the device wells. For example, isolation wells encompass the device wells. The isolation wells are first type doped wells. For example, n-type isolation wells are used to isolate p-type device wells. Separate implants may be employed to form different doped device wells and isolation wells using, for example, implant masks, such as photoresist masks. The wells, for example, are formed after forming isolation regions.

Gates of transistors are formed on the substrate. For example, layers of the gate, such as gate dielectric and gate electrode, are formed on the substrate and patterned to form the gates 1144. The gate dielectric may be a silicon oxide layer while the gate electrode layer may be polysilicon. The gate electrode may be doped, for example, to reduce sheet resistance. Other types of gate dielectric and gate electrode layers may also be useful. The gate dielectric layer may be formed by thermal oxidation and the gate electrode layer may be formed by chemical vapor deposition (CVD). Separate processes may be performed for forming gate dielectrics of the different voltage transistors. This is due to, for example, different gate dielectric thicknesses associated with the different voltage transistors. For example, high voltage (HV) transistor will have a thicker gate dielectric than a low voltage (LV) transistor.

The gate layers are patterned by, for example, mask and etch techniques. For example, a patterned photoresist mask may be provided over the gate layers. For example, a photoresist layer is formed over the gate layers and lithographically exposed by using a reticle. The photoresist mask layer is developed, forming a patterned photoresist mask with the desired pattern of the reticle. To improve lithographic resolution, an anti-reflective coating (ARC) layer may be provided between the gate electrode layer and the photoresist mask layer. An anisotropic etch, such as a reactive ion etch (RIE) is used to pattern the gate layers to form the gates using the patterned photoresist mask.

Doped contact regions, such as source/drain (S/D) regions and well or substrate taps are formed in exposed active regions of the substrate 1105 after forming the gates. The contact regions are heavily doped regions. Depending on the type of transistor and well tap, the contact regions may be heavily doped n-type or p-type regions. For n-type transistors, S/D regions are heavily doped n-type regions and for p-type transistors, S/D regions are heavily doped p-type regions. For well taps, they are the same dopant type as the well.

A S/D region may include lightly doped diffusion (LDD) and halo regions. A LDD region is a lightly doped region with first polarity type dopants while the halo region is a lightly doped region with second polarity type dopants. For example, the halo region includes p-type dopants for a n-type transistor while the LDD region includes n-type dopants for n-type transistors. The halo and LDD regions extend under the gate. A halo region extends farther below the gate than a LDD region. Other configurations of LDD, halo and S/D regions may also be useful.

Dielectric spacers (not shown) may be provided on the gate sidewalls of the transistors. The spacers may be used to facilitate the formation of halo, LDD and S/D regions. For example, spacers are formed after halo and LDD regions are formed. Spacers may be formed by, for example, forming a spacer layer on the substrate and anisotropically etching it to remove horizontal portions, leaving the spacers on the sidewalls of the gates. After forming the spacers, an implant is performed to form the S/D regions. Separate implants may be employed to form different doped regions using, for example, implant masks, such as photoresist mask. Well taps of the same dopant type as S/D regions are formed at the same time.

As shown, the FEOL processing forms a cell region isolated by an isolation region 1180, such as a STI region. The cell region is for a memory cell. Isolation regions may be provided to isolate columns of memory cells. Other configurations of isolation regions may also be useful. The cell region may include a cell device well (not shown). The cell device well, for example, serves as a body well for a transistor of the memory cell. The device well may be doped with second polarity type dopants for first polarity type transistors. The device well may be lightly or intermediately doped with second polarity type dopants. In some cases, a cell device isolation well (not shown) may be provided, encompassing the cell device well. The isolation well may have a dopant type which has an opposite polarity to that of the cell device well. For example, the isolation well may include first polarity type dopants. The isolation well serves to isolate the cell device well from the substrate. Well biases may be provided to bias the wells.

The cell device well may be a common well for the cell regions in the array region. For example, the cell device well may be an array well. The cell device isolation well may serve as the array isolation well. Other configurations of device and isolation wells may also be useful. Other device regions of the device may also include device and/or device isolation wells.

The memory cell includes a cell selector unit 1140 and a storage unit 1110. The FEOL forms the cell selector unit 1140 in the cell region. The cell selector unit 1140 includes a selector for selecting the memory cell. The selector, for example, may be a select transistor. In one embodiment, the select transistor is a metal oxide semiconductor (MOS) transistor. The transistor, as shown, includes first and second source/drain (S/D) regions 1145 and 1146 formed in the substrate 1105 and a gate 1144 disposed on the substrate between the S/D regions. The first S/D region 1145 may be referred to as a drain region and the second S/D region 1146 may be referred to as a source region. The S/D regions, for example, are heavily doped regions with first polarity type dopants, defining the type of transistor. For example, in the case of a n-type transistor, the S/D regions are n-type heavily doped regions. Other types of transistors or selectors may also be useful.

As for the gate 1144, it includes a gate electrode over a gate dielectric. The gate electrode may be polysilicon while the gate dielectric may be silicon oxide. Other types of gate electrode and gate dielectric materials may also be useful. A gate, for example, may be a gate conductor along a first or wordline direction. The gate conductor forms a common gate for a row of memory cells.

As discussed, a S/D region may include LDD and halo regions (not shown). Dielectric spacers (not shown) may be provided on the gate sidewalls of the transistors to facilitate forming transistor halo, LDD and transistor S/D regions. It is understood that not all transistors include LDD and/or halo regions.

After forming the cell selector unit 1140 and other transistors, back-end-of-line (BEOL) processing is performed. The BEOL process includes forming interconnects in interlevel dielectric (ILD) layers 1190. The interconnects connect the various components of the integrated circuit (IC) to perform the desired functions. An ILD layer includes a metal level 1194 and a contact level 1192. Generally, the metal level 1194 includes conductors or metal lines 1195 while the contact level 1192 includes contacts 1193. The conductors and contacts may be formed of a metal, such as copper, copper alloy, aluminum, tungsten or a combination thereof. Other suitable types of metal, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other techniques, such as reactive ion etch (RIE) may also be employed to form metal lines.

A device may include a plurality of ILD layers or levels. For example, x number of ILD levels may be provided. As illustrated, the device includes 5 ILD levels (x=5). Other numbers of ILD levels may also be useful. The numbers of ILD levels may depend on, for example, design requirements or the logic process involved. A metal level of an ILD level may be referred to as $M_i$, where i is from 1 to x and is the $i^{th}$ ILD level of x ILD levels. A contact level of an ILD level may be referred to as $V_{i-1}$, where i is the $i^{th}$ ILD level of x ILD levels.

The BEOL process, for example, commences by forming a dielectric layer over the transistors and other components are formed in the FEOL process. The dielectric layer may be silicon oxide. For example, the dielectric layer may be silicon oxide formed by chemical vapor deposition (CVD). The dielectric layer serves as a pre-metal dielectric layer or first contact layer of the BEOL process. The dielectric layer may be referred to as CA level of the BEOL process. Contacts are formed in the CA level dielectric layer. The contacts may be formed by single damascene processes. Via openings are formed in the dielectric layer using mask and etch techniques. For example, a patterned resist mask with openings corresponding to the vias is formed over the dielectric layer. An anisotropic etch, such as RIE, is performed to form the vias, exposing contact regions below, such as S/D regions and gates. A conductive layer, such as tungsten is deposited on the substrate, filling the openings. The conductive layer may be formed by sputtering. Other techniques may also be useful. A planarization process, such as CMP, is performed to remove excess conductive materials, leaving contact plugs in the CA level.

After forming contacts 1193 in the CA level, the BEOL process continues to form dielectric layer over the substrate 1105, covering the CA level dielectric layer. The dielectric layer, for example, serves as a first metal level M1 of the first ILD layer. The upper dielectric layer, for example, is a silicon oxide layer. Other types of dielectric layers may also be useful. The dielectric layer may be formed by CVD. Other techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electro or electroless plating. Other types of conductive layers or forming techniques may also be useful. Excess conductive materials are removed by, for example, CMP, leaving planar surface with M1 dielectric. The first metal level M1 and CA may be referred as a lower ILD level.

The process continues to form additional ILD layers (not shown). For example, the process continues to form upper ILD layers or levels. The upper ILD levels may include ILD level 2 to ILD level x. For example, in the case where x=5 (5 levels), the upper levels include ILD levels from 2 to 5, which include via levels V1 to V4 and metal levels M2 to M5. The number of ILD layers may depend on, for example, design requirements or the logic process involved. The upper ILD layers may be formed of silicon oxide. Other types of dielectric materials, such as low k, high k or a combination of dielectric materials may also be useful. The ILD layers may be formed by, for example, CVD. Other techniques for forming the ILD layers may also be useful.

The conductors and contacts of the upper ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as copper or copper alloy. The conductive layer may be formed by, for example, plating techniques. Excess conductive materials are removed by, for example, CMP, forming conductors and contacts in an upper ILD layer.

A dielectric liner (not shown) may be disposed between ILD levels and on the substrate 1105. The dielectric liner, for example, serves as an etch stop layer. The dielectric liner may be formed of a low k dielectric material. For example, the dielectric liner may be nBLOK. Other types of dielectric materials for the dielectric liner may also be useful.

The uppermost ILD level (e.g., M5) may have different design rules, such as critical dimension (CD), than the lower ILD levels. For example, Mx may have a larger CD than metal levels M1 to Mx−1 below. For example, the uppermost metal level may have a CD which is 2× or 6× the CD of the metal levels below. Other configurations of the ILD levels may also be useful.

As shown, S/D contacts 1193 are disposed in the CA level. The S/D contacts are coupled to the first and second S/D regions of the select transistor. Other S/D contacts coupled to other S/D regions of transistors may also be provided. The CA level may include a gate contact (not shown) coupled to the gate of the select transistor. The gate contact may be disposed in another cross-section of the device. The contacts may be tungsten contacts while contact pads may be copper pads. Other types of contacts and contact pads may also be useful. Other S/D and gate contacts for other transistors may also be provided.

As described, metal lines are provided in M1. The metal lines are coupled to the S/D contacts 1193. In one embodiment, a SL is coupled to the second S/D region 1146 of the select transistor. As for the first S/D contact 1145, it may be coupled to contact pads or island in M1. The contact pads provide connections to upper ILD levels. The metal lines or pads may be formed of copper or copper alloy. Other types of conductive materials may also be useful.

As for the upper ILD, for example, from 2 to 5, they include contacts in the via level and contact pads/metal lines in the metal level. The contacts and contact pads provide connections from M5 to the first S/D region 1145 of the select transistor.

A pad level (not shown) is disposed over the uppermost ILD level. For example, a pad dielectric level is disposed over Mx. In the case where the device includes 5 metal levels, the pad level is disposed over M5. The pad dielectric layer, for example, may be silicon oxide. Other types of dielectric materials may also be useful. The pad dielectric layer includes pads, such as bond pads or pad interconnects for providing external interconnections to the components. Bond pads may be used for wire bonding while pad interconnects may be provided for contact bumps. The external interconnections may be input/output (I/O), power and ground connections to the device. The pads, for example, may be aluminum pads. Other types of conductive pads may also be useful. A passivation layer, such as silicon oxide, silicon nitride or a combination thereof, may be provided over the pad level. The passivation layer includes openings to expose the pads.

A dielectric liner may be disposed between the uppermost metal level and pad level. The dielectric liner, for example, serves as an etch stop layer during via etch process and it may also serve as a diffusion barrier layer for, for example, copper (Cu) layer. The dielectric liner may be a low k dielectric liner. For example, the dielectric liner may be nBLOK. Other suitable types of dielectric materials for the dielectric liner may also be useful.

The storage unit 1110 of the memory cell is disposed in a storage dielectric layer 1150. The storage dielectric layer 1150 may be a via level of an ILD level. As shown, the storage dielectric layer 1150 is V1. Providing the storage dielectric layer at other via levels may also be useful. In other embodiments, the storage dielectric layer 1150 may be a dedicated storage dielectric layer and is not part of an interconnect level. Other configurations of storage dielectric layer may also be useful. The storage unit 1110 includes a storage element disposed between bottom and top electrodes, forming a pMTJ element. The storage element, in one embodiment, is a bottom pinned pMTJ storage element, such as that described in FIGS. 1 to 4. Common elements may not be described or described in detail.

In one embodiment, the bottom electrode of the storage unit is coupled to a drain of the select transistor. For example, the bottom electrode is coupled to a contact pad in the M1 level and a via contact in the CA level. Other configurations of coupling the bottom electrode may also be useful. The top electrode is coupled to a BL. For example, the top electrode is coupled to the BL disposed in M2. The BL is along a bitline direction. As for the source of the select transistor, it is coupled to a SL. For example, a via contact in CA is provided to couple the source region of the select transistor to SL in M1. Providing SL in other levels may also be useful.

As for the gate of cell selector, it is coupled to a WL. The WL, for example, is along a wordline direction. The bitline and wordline directions are perpendicular to each other. As shown, the WL is disposed in M3. The WL may be coupled to the gate by contact pads in M2 and M1 and via contacts in V2 and V1 (not shown). Other configurations of coupling the WL to the gate may also be useful. For example, the WL may be disposed in other metal levels.

Although as described, the various lines and storage element are disposed in specified dielectric levels of the backend dielectric levels, other configurations may also be useful. For example, they may be disposed in other or additional metal levels. For example, the storage element may be provided in an upper via level, such as between M5 and M6 (not shown). Furthermore, the device may include other device regions and components.

FIGS. 8*a*-8*h* show simplified cross-sectional views of an embodiment of a process for forming a device 1200. The process includes forming a memory cell. The memory cell, for example, may be a NVM memory cell. The memory cell, in one embodiment, is a magnetoresistive NVM cell, such as a STT-MRAM cell. The memory cell, for example, is similar to that described in FIG. 7. Common elements may not be described or described in detail. The cross-sectional views, for example, are along the bitline direction. Although the cross-sectional views show one memory cell, it is understood that the device includes a plurality of memory cells of, for example, a memory array. In addition, the memory cell can be formed simultaneously with CMOS logic devices on the same substrate.

The simplified cross-sectional views illustrate an upper ILD level 1290. For example, a substrate (not shown) has been processed with FEOL and BEOL processing, as already described, to include the upper ILD level. FEOL processing, for example, forms transistors, including a select transistor of the memory cell. Other types of devices may also be formed on the same substrate. BEOL processing forms interconnects in ILD levels. The upper ILD level includes a via level 1292 and a metal level 1294. For example, the upper ILD level includes V4 and M5. The via level, as shown, includes via contacts 1293 while the metal level includes interconnects. For example, interconnect 1295*b* is a cell contact pad for coupling to a storage unit and interconnect 1295*a* is coupled to a pad interconnect. The interconnects, for example, are copper interconnects. Other suitable types of interconnects may also be useful.

Figure 8A:
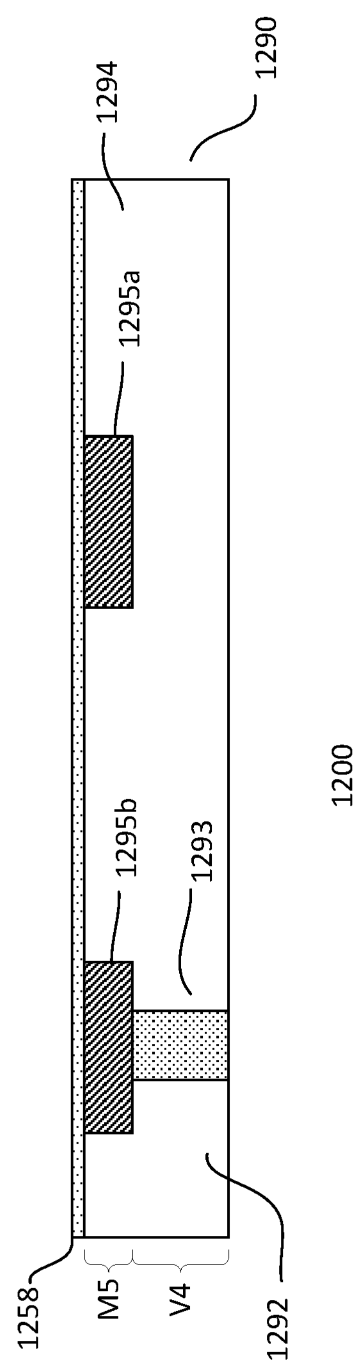
FIGS. 8*a*-8*h* show cross-sectional views of an embodiment of a process for forming a memory cell.

Referring to FIG. 8*a*, a dielectric liner 1258, in one embodiment, is disposed above the metal level. The dielectric liner, for example, serves as an etch stop layer. The dielectric liner may be a low k dielectric liner. For example, the dielectric liner may be nBLOK. Other types of dielectric materials for the dielectric liner may also be useful. The dielectric liner, for example, is formed by CVD. Other suitable techniques for forming the dielectric liner may also be useful.

Figure 8B:
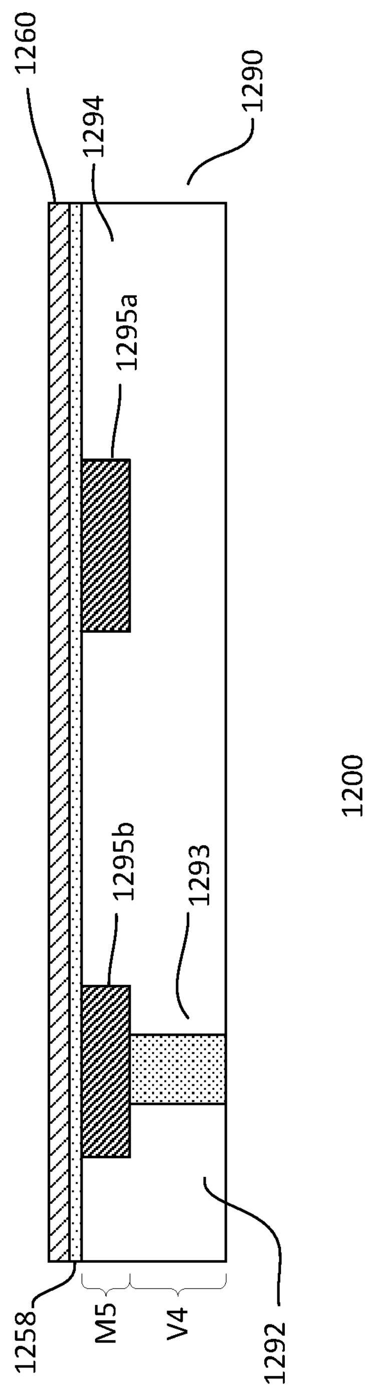

The process continues to form a dielectric layer. As shown in FIG. 8*b*, a lower dielectric 1260 is formed on the dielectric liner 1258. The lower dielectric layer, in one embodiment, includes oxide material. The lower dielectric layer may be formed by CVD. Other suitable forming techniques or suitable thicknesses for the lower dielectric layer may also be useful.

Figure 8C:
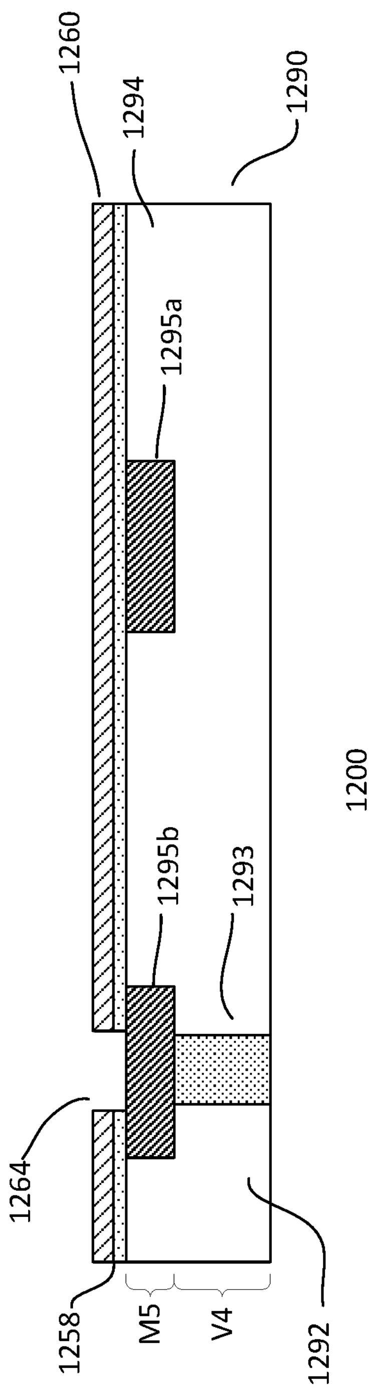

In FIG. 8*c*, the lower dielectric layer 1260 and the dielectric liner 1258 are patterned to form a storage unit opening 1264. The storage unit opening 1264, for example, is a via opening for accommodating a lower portion of a subsequently formed storage stack. The storage unit opening 1264 exposes a cell contact pad 1295*b* in the metal level below. The opening may be formed by mask and etch techniques. For example, a patterned photoresist mask may be formed over the lower passivation layer, serving as an etch mask. An etch, such as RIE, may be performed to pattern the lower passivation layer using the patterned resist etch mask. In one embodiment, the etch transfers the pattern of the mask to the lower passivation layer, including the dielectric liner to expose the cell contact pad below.

Figure 8D:
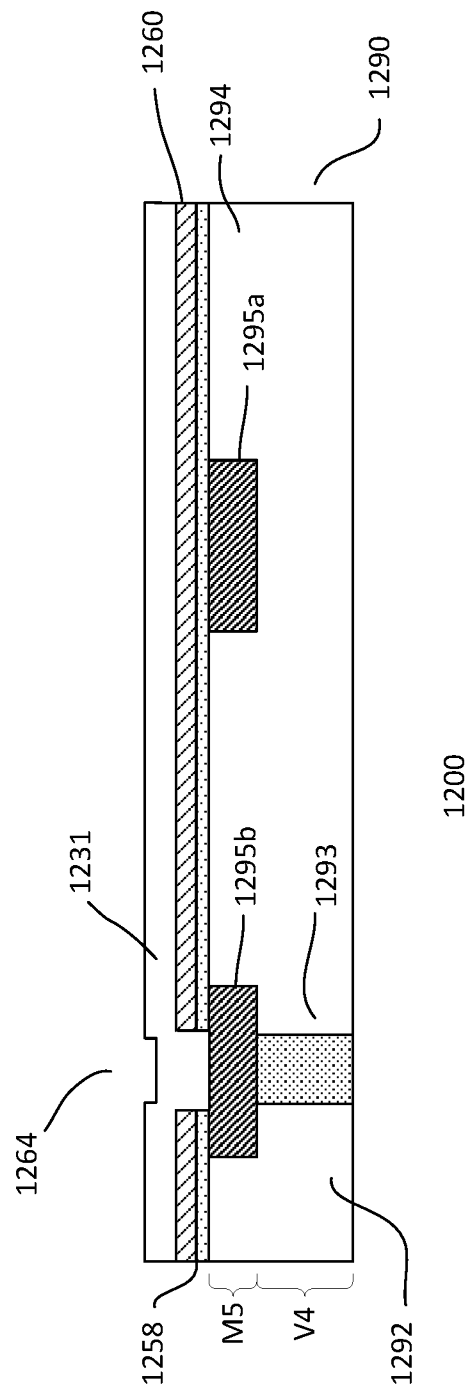

Referring to FIG. 8*d*, the process continues to form a storage stack. The storage stack may be a magnetic storage stack. The magnetic storage stack is, for example, a MTJ stack, similar to those describe in FIGS. 2-4. The MTJ stack may include various layers configured as a bottom pinned MTJ stack similar to those described in FIGS. 2-4. The MTJ stack forms a storage unit of a MRAM cell.

The MTJ stack, for example, includes a storage stack disposed between top and bottom electrodes. The bottom electrode is coupled to a contact pad in the metal level below. For example, the bottom electrode is coupled to a contact pad 1295*b* in M5. This provides connections of the MTJ stack to the first S/D region 1145 of the cell select transistor as described in FIG. 7. As for the top electrode, it is exposed at the top of the intermediate dielectric layer.

Figure 8E:
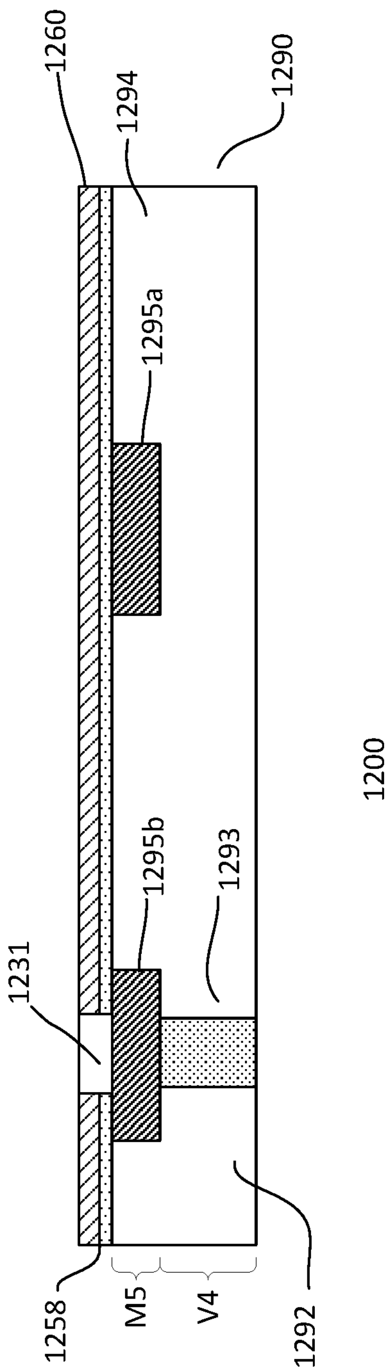

The various layers of the MTJ stack are formed on the substrate. For example, the various layers of the MTJ stack are sequentially formed over the lower passivation layer and fill the opening. After the opening 1264 is formed, a bottom electrode layer 1231, such as Ta or TaN is deposited over the lower passivation layer and fills the opening as shown in FIG. 8*d*. A chemical mechanical polishing (CMP) process is applied to form an embedded bottom electrode in the opening 1264 and remove excess bottom electrode layer in other areas. Other suitable bottom electrode materials and techniques may be employed. The bottom electrode 1231 fills the opening and the surface is flat as shown in FIG. 8*e*.

Figure 8F:
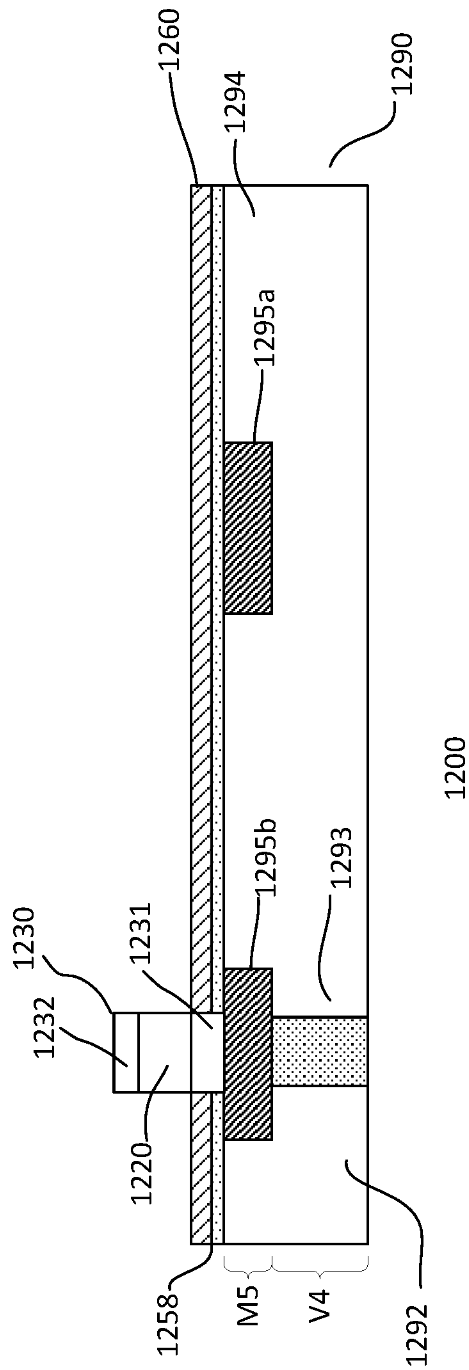

Referring to FIG. 8*f*, the process continues to form remaining layers of the MTJ stack, such as the storage stack 1220 and the top electrode 1232, on top of the bottom electrode by physical vapor deposition (PVD) process. The layers of the MTJ stack are patterned to form the MTJ stack 1230 as shown. Patterning the layers maybe achieved with a non-conducting mask and etch techniques. After forming the MTJ stack 1230, the non-conducting mask layer used to pattern the MTJ stack is removed if dielectric ARC or oxide hard mask layer is used. Other suitable techniques for forming the MTJ stack may also be useful.

In one embodiment, the substrate is subjected to an alloying process. The alloying process includes annealing the substrate to around 400° C. with duration of about 1-2 hours and with hydrogen ambient. Other annealing parameters may also be useful.

Figure 8G:
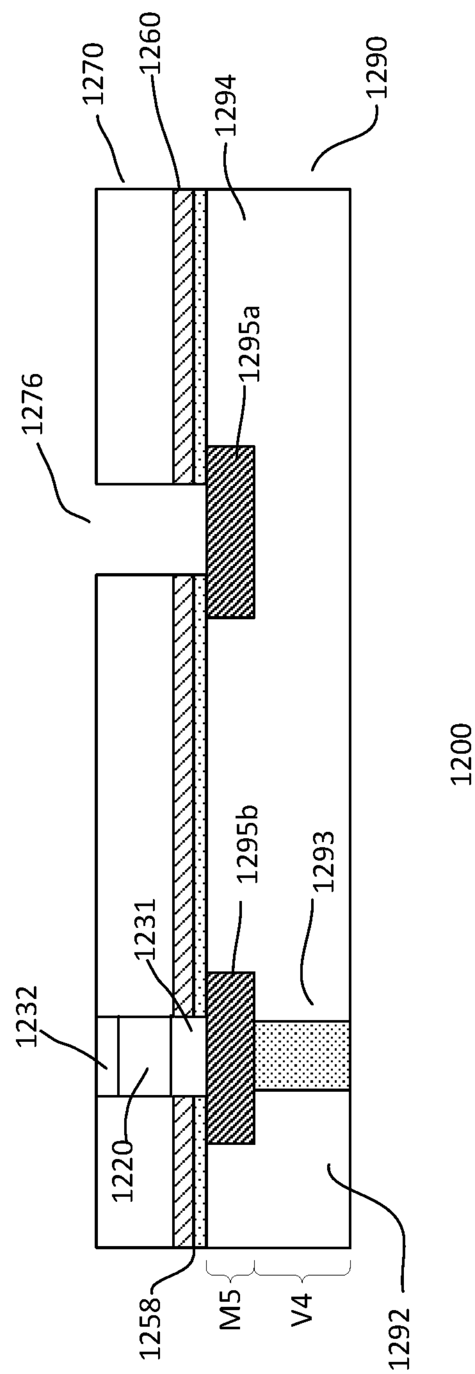

An intermediate dielectric layer 1270 which serves as a storage dielectric layer is formed on the substrate, as shown in FIG. 8*g*. The dielectric layer is formed over the lower dielectric layer 1260 and sufficiently covers the MTJ stack. The intermediate dielectric layer, for example, is silicon oxide. Other types of intermediate dielectric layers may also be useful. The intermediate dielectric layer may be formed by CVD. Other techniques for forming the dielectric layer may also be useful.

A planarizing process is performed on the substrate, planarizing the intermediate dielectric layer. The planarizing process, for example, is a CMP process. The CMP process produces a planar top surface between the top of the MTJ stack and the intermediate dielectric layer. The intermediate dielectric layer is patterned to form a via opening 1276. The via opening is patterned by mask and etch techniques. The via opening penetrates through the various dielectric layers and the dielectric liner. This exposes the interconnect 1295*a* in the lower metal level. After forming the via opening, the mask layer is removed. For example, the mask and ARC layers are removed.

Figure 8H:
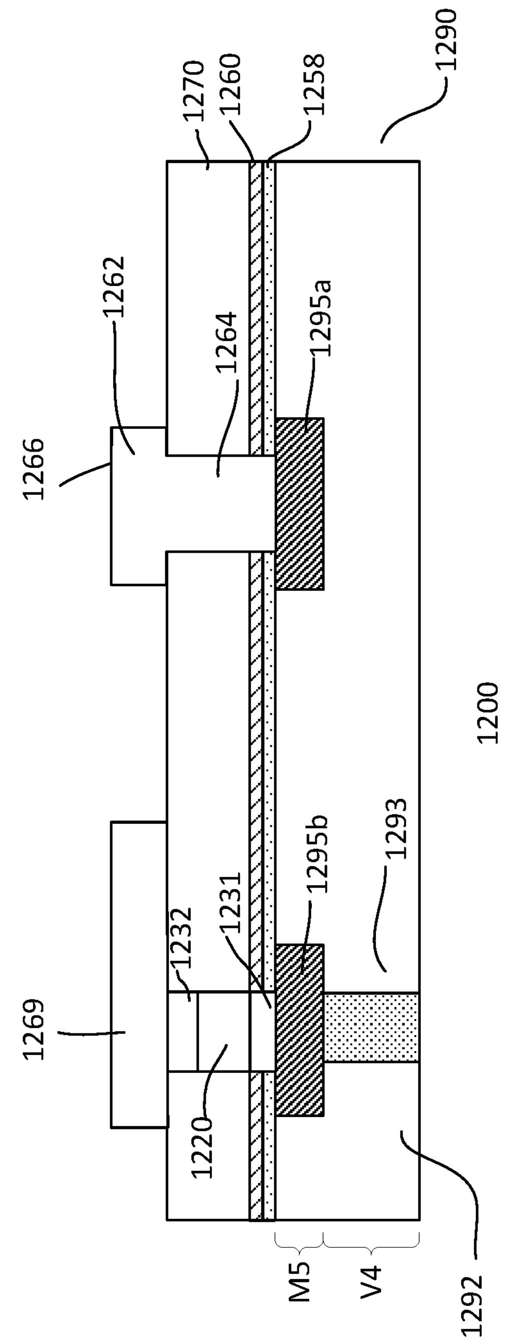

Referring to FIG. 8*h*, a conductive layer is formed on the substrate. The conductive layer covers the intermediate dielectric layer and MTJ stack as well as filling the via opening. The conductive layer should be sufficiently thick to serve as a metal line or an interconnect. The conductive layer, for example, includes a copper layer. Other suitable types of conductive layers may also be useful. The conductive layer may be formed by, for example, sputtering. Other suitable techniques for forming the conductive layer may also be useful.

The conductive layer is patterned to form a metal line 1269 and an interconnect 1266. Patterning the conductive layer to form the metal line and interconnect may be achieved by mask and etch techniques. For example, a patterned photoresist mask (not shown) may be formed over the conductive layer. An etch, such as RIE, may be used to pattern the conductive layer with a patterned resist mask. In one embodiment, the interconnect 1266 includes a via contact 1264 in the via opening and a contact 1262 over the intermediate dielectric layer 1270. The metal line 1269, for example, may serve as the BL. After patterning the conductive layer, the mask layer is removed. For example, the mask and ARC layers are removed.

Additional processes may be performed to complete the formation of the device. For example, the processes may include forming additional ILD levels, pad level, passivation level, pad opening, dicing, assembly and testing. Other types of processes may also be performed.

Although the storage stack of the memory cell as described above includes a MTJ stack such as that shown in FIGS. 2 to 4, it is understood that other suitable configurations and other types of MTJ stack may be used. In addition, the process as described in FIGS. 8*a*-8*h* is also applicable to other suitable types of memory cell, such as but not limited to memory cells which are sensitive to high temperature processing.

The embodiments as described result in various advantages. For example, the alloying process performed at high temperature, such as 400° C. is important to maintain the performance and reliability of devices other than the MTJ stack. In the embodiments as described, the provision of the texture breaking layer having the composite spacer layer improves the thermal budget and is compatible with the alloying process. For example, the composite layer includes a diffusion barrier layer (Magnesium spacer layer) which blocks the diffusion of tantalum metal into the polarizer and tunnel barrier layers, thereby enhances the TMR of the MTJ element at high anneal temperature (e.g., 400° C.). Furthermore, the composite spacer layer may reduce the total magnetic moment in the second magnetic layer of the SAF layer, minimizing stray field which results in reduced offset field of the free layer. In some of the embodiments, the composite spacer layer which includes Ru spacer layer improves the PMA of the second magnetic layer of the SAF layer adjacent thereto and further reduces the overall thickness of the second magnetic layer of the SAF layer. This could lead to minimized thickness of a pMTJ stack. Moreover, the process as described is highly compatible with logic processing or technology.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method of forming a device comprising:
- providing a substrate;
- performing back-end-of-line (BEOL) processing to form an inter-level dielectric (ILD) layer on the substrate, wherein the ILD layer comprises a plurality of ILD levels; and
- forming a magnetic tunneling junction (MTJ) stack in between adjacent ILD levels, wherein the MTJ stack comprises
  - a magnetic fixed layer, the magnetic fixed layer comprises
    - a synthetic antiferromagnetic (SAF) layer,
    - a composite spacer layer disposed on the SAF layer, the composite spacer layer comprises
      - a first non-magnetic (NM) spacer layer,
      - a magnetic (M) spacer layer disposed on the first NM spacer layer, and
      - a second NM spacer layer disposed on the M spacer layer, and
    - a reference layer disposed on the composite spacer layer,
  - a tunneling barrier layer disposed on the magnetic fixed layer, and
  - a magnetic free layer disposed on the tunneling barrier layer.

2. The method of claim 1 wherein the MTJ stack is disposed between the adjacent ILD levels of an upper ILD layer.

3. The method of claim 1 wherein:
- the M spacer layer comprises a cobalt-based (Co-based) magnetic layer; and
- the first and second NM spacer layers comprise tantalum (Ta), molybdenum (Mo), tungsten (W), niobium (Nb), ruthenium (Ru), titanium (Ti) or a combination thereof.

4. The method of claim 3 wherein the Co-based M spacer layer comprises cobalt-iron/nickel-boron alloy (Co(Fe, Ni)B).

5. The method of claim 3 wherein the Co-based M spacer layer comprises a Co-based magnetically continuous amorphous layer.

6. The method of claim 4 wherein M spacer layer comprises:
- a concentration of Boron (B) comprising about 0-40%; and
- a concentration of Cobalt (Co) comprising about 20-60%.

7. The method of claim 3 wherein the first and second NM spacer layers comprise Ta.

8. The method of claim 1 wherein the M spacer layer comprises a monolayer.

9. The method of claim 8 wherein the M spacer layer comprises a discontinuous layer.

10. The method of claim 1 wherein forming the composite spacer layer comprises co-sputtering using a sputter target comprising materials of the M and NM spacer layers.

11. The method of claim 1 wherein:
the NM spacer layers are formed by sputtering using krpton (Kr) or xenon (Xe) gas at 75 W; and
the M spacer layer is formed by sputtering using argon (Ar) gas at 600 W.

12. The method of claim 1 wherein:
the first NM spacer layer serves as a base layer (BL);
the M spacer layer and second NM spacer layer form a bilayer (M/NM); and
the composite spacer layer comprises (BL)/(M/NM)n, wherein n is the number of bilayers on the BL in the composite stack and n≥1.

13. The method of claim 12 wherein n is equal to 1-5.

14. The method of claim 1 wherein the MTJ stack comprises:
a cap layer disposed on the magnetic free layer;
a seed layer disposed below the magnetic fixed layer; and
the MTJ stack is disposed between top and bottom electrodes.

15. The method of claim 14 further comprises a second tunneling barrier layer disposed between the magnetic free layer and cap layer.

16. The method of claim 1 wherein the magnetic free layer comprises a magnetic coupling stack, the magnetic coupling stack comprises:
a first magnetic free layer;
a free spacer layer disposed on the first magnetic free layer; and
a second magnetic free layer.

17. The method of claim 16 wherein the free spacer layer comprises a composite free spacer layer, the composite free spacer layer comprises:
a first NM free spacer layer;
a M free spacer layer disposed on the first NM free spacer layer; and
a second NM free spacer layer disposed on the M free layer.

18. A method of forming a device comprising:
providing a substrate comprising circuit component formed on a substrate surface;
performing BEOL processing to form an inter-level dielectric (ILD) layer on the substrate, wherein the ILD layer comprises a plurality of ILD levels; and
forming a magnetic tunneling junction (MTJ) stack in between adjacent ILD levels of an upper ILD layer, wherein the MTJ stack comprises
a bottom electrode layer,
a seed layer disposed on the bottom electrode,
a magnetic fixed layer, the magnetic fixed layer comprises
a synthetic antiferromagnetic (SAF) layer,
a composite spacer layer disposed on the SAF layer, the composite spacer layer comprises
a first non-magnetic (NM) spacer layer,
a magnetic (M) spacer layer disposed on the first NM spacer layer, and
a second NM spacer layer disposed on the magnetic spacer layer, and
a reference layer disposed on the composite spacer layer,
a tunneling barrier layer disposed on the magnetic fixed layer,
a magnetic free layer disposed on the tunneling barrier layer,
a cap layer disposed on the magnetic free layer, and
a top electrode disposed on the cap layer.

19. A device comprising:
a substrate;
an inter level dielectric (ILD) layer disposed on the substrate, wherein the ILD layer comprises a plurality of ILD levels; and
a magnetic tunneling junction (MTJ) stack disposed between adjacent ILD levels, wherein the MTJ stack comprises
a magnetic fixed layer, the magnetic fixed layer comprises
a synthetic antiferromagnetic (SAF) layer,
a composite spacer layer disposed on the SAF layer, the composite spacer layer comprises
a first non-magnetic (NM) spacer layer,
a magnetic (M) spacer layer disposed on the first NM spacer layer, and
a second NM spacer layer disposed on the M spacer layer, and
a reference layer disposed on the composite spacer layer,
a tunneling barrier layer disposed on the magnetic fixed layer, and
a magnetic free layer disposed on the tunneling barrier layer.

20. The device of claim 19 wherein:
the first NM spacer layer serves as a base layer (BL);
the M spacer layer and second NM spacer layer form a bilayer (M/NM); and
the composite spacer layer comprises (BL)/(M/NM)n, wherein n is the number of bilayers on the BL in the composite stack and n≥1.

* * * * *